US010381408B2

(12) United States Patent
Apodaca et al.

(10) Patent No.: US 10,381,408 B2
(45) Date of Patent: Aug. 13, 2019

(54) METHOD TO FABRICATE DISCRETE VERTICAL TRANSISTORS

(71) Applicant: Western Digital Technologies, Inc., Irvine, CA (US)

(72) Inventors: Mac D. Apodaca, San Jose, CA (US); Daniel Robert Shepard, North Hampton, NH (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/080,477

(22) Filed: Mar. 24, 2016

(65) Prior Publication Data
US 2017/0279043 A1 Sep. 28, 2017

(51) Int. Cl.
| H01L 27/115 | (2017.01) |
| H01L 27/24 | (2006.01) |
| G11C 11/16 | (2006.01) |
| H01L 27/22 | (2006.01) |

(52) U.S. Cl.
CPC ...... *H01L 27/2454* (2013.01); *G11C 11/1659* (2013.01); *H01L 27/228* (2013.01); *G11C 2213/74* (2013.01)

(58) Field of Classification Search
CPC . H01L 27/088; H01L 27/0886; H01L 27/092; H01L 27/0924; H01L 27/11578; H01L 27/1158; H01L 27/11582; H01L 27/11551; H01L 27/11568; H01L 29/7827
See application file for complete search history.

(56) References Cited

U.S. PATENT DOCUMENTS

| 5,197,030 A | 3/1993 | Akaogi et al. |
| 5,386,150 A | 1/1995 | Yonemoto |
| 5,712,824 A | 1/1998 | Uchihira |
| 6,018,176 A | 1/2000 | Lim |
| 6,229,746 B1 | 5/2001 | Tooher |
| 6,256,224 B1 | 7/2001 | Perner et al. |
| 6,400,612 B1 | 6/2002 | Patti |
| 6,963,518 B2 | 11/2005 | Sasaki et al. |

(Continued)

OTHER PUBLICATIONS

Method of Fabrication of Strained-SiGe Vertical Transistor <https://priorart.ip.com/IPCOM/000237153>.

(Continued)

*Primary Examiner* — Daniel Whalen
*Assistant Examiner* — Scott Stowe
(74) *Attorney, Agent, or Firm* — The Marbury Law Group PLLC

(57) ABSTRACT

The present disclosure generally relates to the fabrication of metal-oxide-semiconductor (MOS) select transistors in a vertical orientation such that the transistor pair fits within the footprint of a $4F^2$ memory cell. The present disclosure further relates to the simultaneous fabrication of a vertical stack of transistors in which each transistor is distinct, as opposed to being serially connected in a NAND-like string. An initial stack of materials is built to include silicon layers to act as source and drain regions as well as to serve as epitaxial growth seed points. As such, the transistor disclosed may be utilized in conjunction with memory elements such as Phase Change, Resistive, or Magnetic RAM memory within array designs, among others.

19 Claims, 19 Drawing Sheets

(56) References Cited

U.S. PATENT DOCUMENTS

| | | | |
|---|---|---|---|
| 7,005,350 B2 * | 2/2006 | Walker | H01L 27/11568 |
| | | | 257/344 |
| 7,489,589 B2 | 2/2009 | Chen et al. | |
| 7,505,326 B2 | 3/2009 | Sivero et al. | |
| 8,059,454 B2 | 11/2011 | Li et al. | |
| 8,084,807 B2 | 12/2011 | Ishiduki et al. | |
| 8,404,536 B2 | 3/2013 | Mouli | |
| 2004/0005755 A1 * | 1/2004 | Moniwa | G11C 11/412 |
| | | | 438/222 |
| 2004/0027907 A1 | 2/2004 | Ooishi | |
| 2005/0148173 A1 | 7/2005 | Shone | |
| 2008/0029811 A1 * | 2/2008 | Yun | H01L 29/0653 |
| | | | 257/330 |
| 2014/0087534 A1 | 3/2014 | Choe et al. | |
| 2014/0269008 A1 | 9/2014 | Baker | |
| 2015/0138880 A1 | 5/2015 | Russo et al. | |
| 2015/0179230 A1 | 6/2015 | Zhang | |
| 2017/0263314 A1 | 9/2017 | Apodaca et al. | |

OTHER PUBLICATIONS

Apodaca, et al., Office Action dated Apr. 30, 2018 for U.S. Appl. No. 15/068,213.

Apodaca, et al., Office Action dated Jul. 26, 2017 for U.S. Appl. No. 15/068,213.

Yakopcic, et al., Hybrid Crossbar Architecture for a Memristor Based Memory, <http://arxiv.org.ftp/arxiv/papers/1302/1302.6515.pdf> IEEE.

Apodaca, et al., Notice of Allowance dated Aug. 15, 2018 for U.S. Appl. No. 15/068,213.

* cited by examiner

METHOD TO FABRICATE DISCRETE VERTICAL TRANSISTORS

BACKGROUND OF THE DISCLOSURE

Field of the Disclosure

Embodiments of the present disclosure generally relate to data storage and computer memory systems, and more particularly to metal-oxide-semiconductor (MOS) select transistors formed in a vertical orientation.

Description of the Related Art

Memory devices are typically provided as internal, semiconductor, integrated circuits in computers or other electronic devices. Many types of memory exist including random access memory (RAM), read only memory (ROM), dynamic random access memory (DRAM), synchronous dynamic random access memory (SDRAM), and flash memory; however, each is useful only for 2-D memory fabrication or they are serially connected and, as such, must operate similarly to NAND flash strings.

Flash memory devices have developed into a common source of non-volatile memory for a wide range of electronic applications. Flash memory devices typically use a one-transistor memory cell that allows for high memory densities, high reliability, and lower power consumption. Common uses of flash memory include personal computers, personal digital assistants (PDAs), digital cameras, and cellular phones. The performance of flash memory devices needs to increase as the performance of computer systems increase.

Amorphous silicon (a-Si) based thin film transistors (TFT) have been used to improve transistor performance; however, these transistors have undesirable short channel effects and randomness in device characteristics. This is largely due to the randomness of in polysilicon grain size and grain boundaries that exist in TFT devices.

Silicon carbide (SiC) substrates have been used in power devices due to the higher bandgap over silicon. Wide bandgap materials such as SiC substrates have very low intrinsic carrier concentration and thermal generation scales directly with the intrinsic carrier concentration. Therefore, junction leakage currents in SiC substrate devices are very low. However, SiC substrates suffer numerous problems. For example, wafer sizes in excess of four inches that have high quality and low cost are difficult to achieve. Additionally, the defect densities are unacceptable and the substrates suffer from poor carrier mobility for high speed switching.

Therefore, what is needed in the art is higher performance vertical memory select transistors which maintain area efficiency and increased read and write speed operations in memory cells.

SUMMARY OF THE DISCLOSURE

The present disclosure generally relates to the fabrication of metal-oxide-semiconductor (MOS) select transistors in a vertical orientation such that the transistor pair fits within the footprint of a $4F^2$ memory cell. The present disclosure further relates to the simultaneous fabrication of a vertical stack of transistors in which each transistor is distinct, as opposed to being serially connected in a NAND-like string. An initial stack of materials is built to include silicon layers to act as source and drain regions as well as to serve as epitaxial growth seed points. As such, the transistor disclosed may be utilized in conjunction with memory elements such as Phase Change, Resistive, or Magnetic RAM memory within array designs, among others.

In one embodiment, a memory cell is disclosed. The memory cell includes a first plurality of layers deposited on a substrate, a first hardmask deposited on the first plurality of layers, and an epitaxial silicon material comprising a rounded shape and disposed on a sidewall of each of the first plurality of trenches. A first plurality of trenches are formed through the first hardmask and the first plurality of layers. The memory cell further includes an oxide material deposited in each of the first plurality of trenches, a gate oxide layer deposited in each of the first plurality of trenches, and a first metal material deposited over the gate oxide layer within each of the first plurality of trenches. The memory cell also includes a second plurality of trenches formed parallel to the first plurality of trenches and through the first hardmask and the first plurality of layers. The second plurality of trenches are at least partially filled with a dielectric material. At least one of the second plurality of trenches comprises a second metal material such that a first width of the dielectric material below the second metal material is wider than a second width of the dielectric material above the second metal material.

In another embodiment, a vertical memory cell is disclosed. The vertical memory cell includes a first layer, a second layer, and a plurality of transistors. At least two transistors are disposed in the first layer and at two transistors are disposed in the second layer. A vertical connection connects the first layer to the second layer.

In another embodiment, a method of forming a metal-oxide-semiconductor select transistor in a vertical orientation is disclosed. The method includes depositing a plurality of layers and a first hardmask on a substrate, etching at least one first trench in the plurality of layers and the first hardmask, and growing an epitaxial silicon material having a rounded shape on a side-wall of the first trench and coupled to at least a portion of the plurality of first layers and on a top surface of the substrate. The method further includes filling the at least one first trench with an oxide material, performing a chemical-mechanical polishing to smooth a top surface of the first hardmask, and etching the oxide within the at least one first trench. The method further includes depositing a second hardmask over the first hardmask and the oxide within the at least one first trench, etching the second hardmask such that the second hardmask remains along the sidewalls of the at least one first trench, and etching the at least one trench to the substrate utilizing the first hardmask and the second hardmask as a mask. The method also includes depositing a gate oxide within the at least one first trench and over the first hardmask.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to the fabrication of metal-oxide-semiconductor (MOS) select transistors in a vertical orientation such that the transistor pair fits within the footprint of a $4F^2$ memory cell. The present disclosure further relates to the simultaneous fabrication of a vertical stack of transistors in which each transistor is distinct, as opposed to being serially connected in a NAND-like string. An initial stack of materials is built to include silicon layers to act as source and drain regions as well as to serve as epitaxial growth seed points. As such, the transistor disclosed may be utilized in conjunction with memory elements such as Phase Change, Resistive, or Magnetic RAM memory within array designs, among others.

Figure 1:
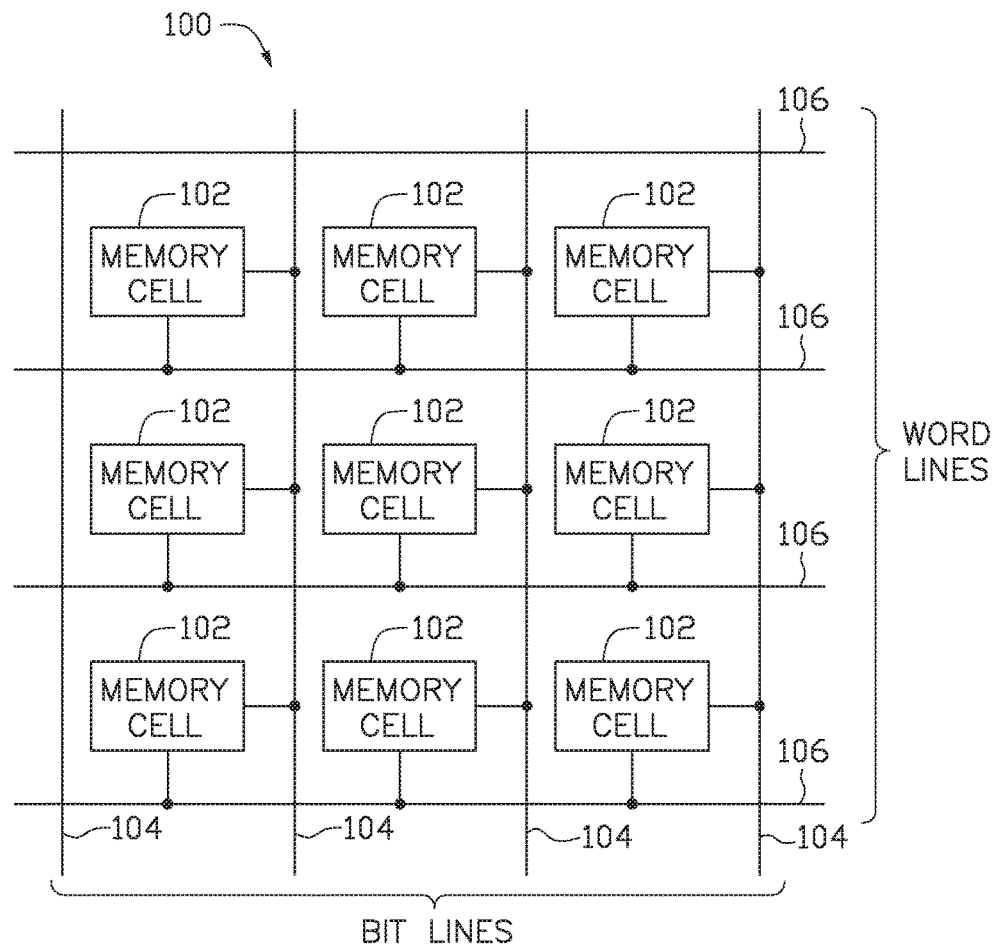
FIG. 1 is a schematic diagram of a memory array, according to one embodiment described herein.

FIG. 1 is a schematic diagram of a memory array 100, according to one embodiment described herein. The memory array 100 includes a plurality of memory cells 102, a first plurality of parallel lines 104, and a second plurality of parallel lines 106. The first plurality of parallel lines 104 run orthogonal to the second plurality of parallel lines 106. The first plurality of parallel lines 104 represent bit lines. The second plurality of parallel lines 106 represent word lines. Each memory cell 102 is coupled to a bit line 104 and a word line 106. Co-linear memory cells 102 are coupled to one common line and one line not in common with the other co-linear memory cells.

Figure 2:
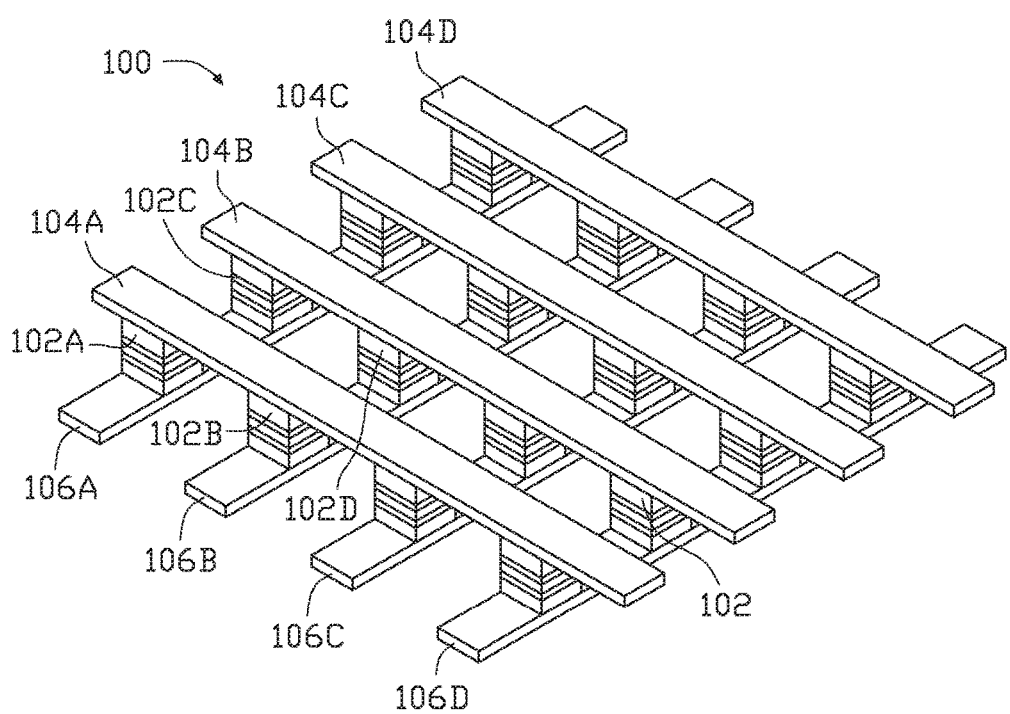
FIG. 2 is a schematic perspective view of the memory array of FIG. 1, according to one embodiment described herein.

FIG. 2 is a schematic perspective view of the above described memory array 100, according to one embodiment described herein. The first plurality of parallel lines 104 are disposed in a common plane. The second plurality of parallel lines 106 are disposed in a common plane spaced above the first plurality of parallel lines 104. The memory array 100 is arranged such that a first memory cell 102A is coupled to a first line 104A of the first plurality of parallel lines 104 and a first line 106A of the second plurality of parallel lines 106. A second memory cell 102B is also coupled to the first line 104A and a second line 106B of the second plurality of parallel lines 106. A third memory cell 102C is coupled to a second line 104B of the first plurality of parallel lines 104. The third memory cell 102C is also coupled to the first line 106A. A fourth memory cell 102D is coupled to both the second line 104B and the second line 106B. It is to be understood that while four lines 104A-104D of the first plurality of lines 104 are shown, more or less lines are contemplated. Furthermore, it is also to be understood that while four lines 106A-106D of the second plurality of lines 106 are shown, more or less lines are contemplated.

Figure 3:
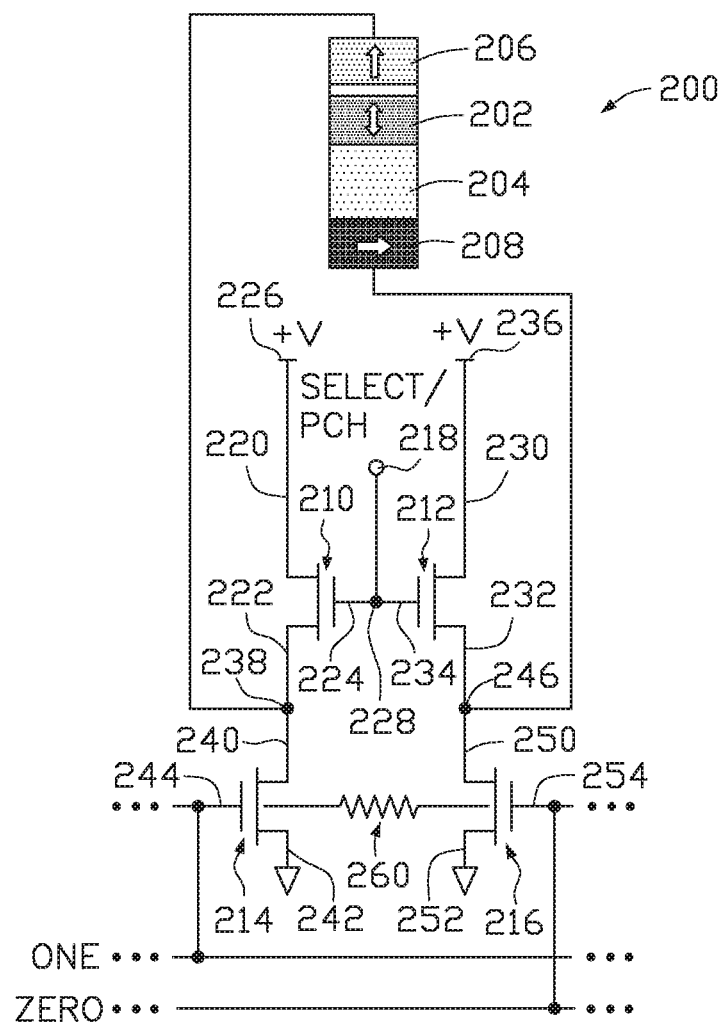
FIG. 3 is a schematic diagram of a memory device comprising transistors in a pulse generator circuit, according to one embodiment described herein.

FIG. 3 is a schematic diagram of a memory device 200, according to one embodiment. The memory device 200 includes memory cell 202 coupled between a bit line 204 and a word line 206. Memory cell 202 is substantially similar to the memory cell 102 described supra, and may comprise the same properties. In some embodiments, the memory device 200 may include a second bit line 208. The second bit line 208 may be coupled to the bit line 204. Each of the bit line 204, the second bit line 208, and/or the word line 206 may comprise an electrode. The bit line 204 and word line 106 are each substantially similar to the first plurality of parallel lines 104 and the second plurality of parallel lines 106, respectively, as described supra with respect to FIG. 1 and FIG. 2.

The memory device 200 further includes a plurality of transistors, and as shown in the embodiment of FIG. 3, the memory device 200 includes a first transistor 210, a second transistor 212, a third transistor 214, and a fourth transistor 216. Each of the first transistor 210, the second transistor 212, the third transistor 214, and the fourth transistor 216 may be a field-effect transistor (FET) which uses an electric field to control the shape and hence the electrical conductivity of the a channel of one type of charge carrier in a semiconductor material.

Each of the first transistor 210, the second transistor 212, the third transistor 214, and the fourth transistor 216 includes at least three terminals: a source electrode, a drain electrode, and a gate electrode. The source electrode is the terminal through which carriers enter the channel. The drain electrode is the terminal through which carriers leave the channel. The gate electrode is the terminal that modulates the channel conductivity.

The first transistor 210 includes a first source electrode 220, a first drain electrode 222, and a first gate electrode 224. The first source electrode 220 is coupled to a first voltage source 226. The first drain electrode 222 is further coupled to the word line 206. The second transistor 212 includes a second source electrode 230, a second drain electrode 232, and a second gate electrode 234. The second source electrode 230 is coupled to a second voltage source 236. The second drain electrode 232 is further coupled to the bit line 204. In some embodiments, the second drain electrode 232 is coupled to the second bit line 208. The first gate electrode 224 is coupled to the second gate electrode 234 at a first common node 228. The first common node 228 may further be coupled to a select pre-charge 218, wherein the select pre-charge 218 precharges the plurality of transistors. As such, the select pre-charge 218 is coupled to the first gate electrode 224 and the second gate electrode 234.

The third transistor 214 includes a third source electrode 240, a third drain electrode 242, and a third gate electrode 244. The fourth transistor 216 includes a fourth source electrode 250, a fourth drain electrode 252, and a fourth gate electrode 254.

As further shown in FIG. 3, the first drain electrode 222 is coupled to third source electrode 240 at a second common node 238. The second drain electrode 232 is coupled to the fourth source electrode 250 at a third common node 246. A resistor 260 is coupled between the third transistor 214 and the fourth transistor 216.

In some embodiments, the first transistor 210 and the second transistor 212 drive the current, while the third transistor 214 and the fourth transistor 216 select the polarity of the pulse. The two current driving transistors for each memory cell 202 may share the same gate signal. Furthermore, the two polarity driving transistors for each memory cell 202 may have gates attached to first and second programming signals. It is contemplated that in some embodiments different combinations of at least two transistors may drive the current, while a different combination of two other transistors select the plurality of the pulse.

Furthermore, in some embodiments, the memory cell 200 may include at least two transistors, such as the first transistor 210 and the second transistor 212 described supra, in a first layer and at least two transistors, such as the third transistor 214 and the fourth transistor 216 described supra, in a second layer. A vertical connection, which may comprise a silicon material, connects the first layer to the second layer.

The memory cell 202 and surrounding space of the memory device 200 of FIG. 3 has a size of $4F^2$, where F is the minimum lithographic feature of the densest process layer.

Figure 4:
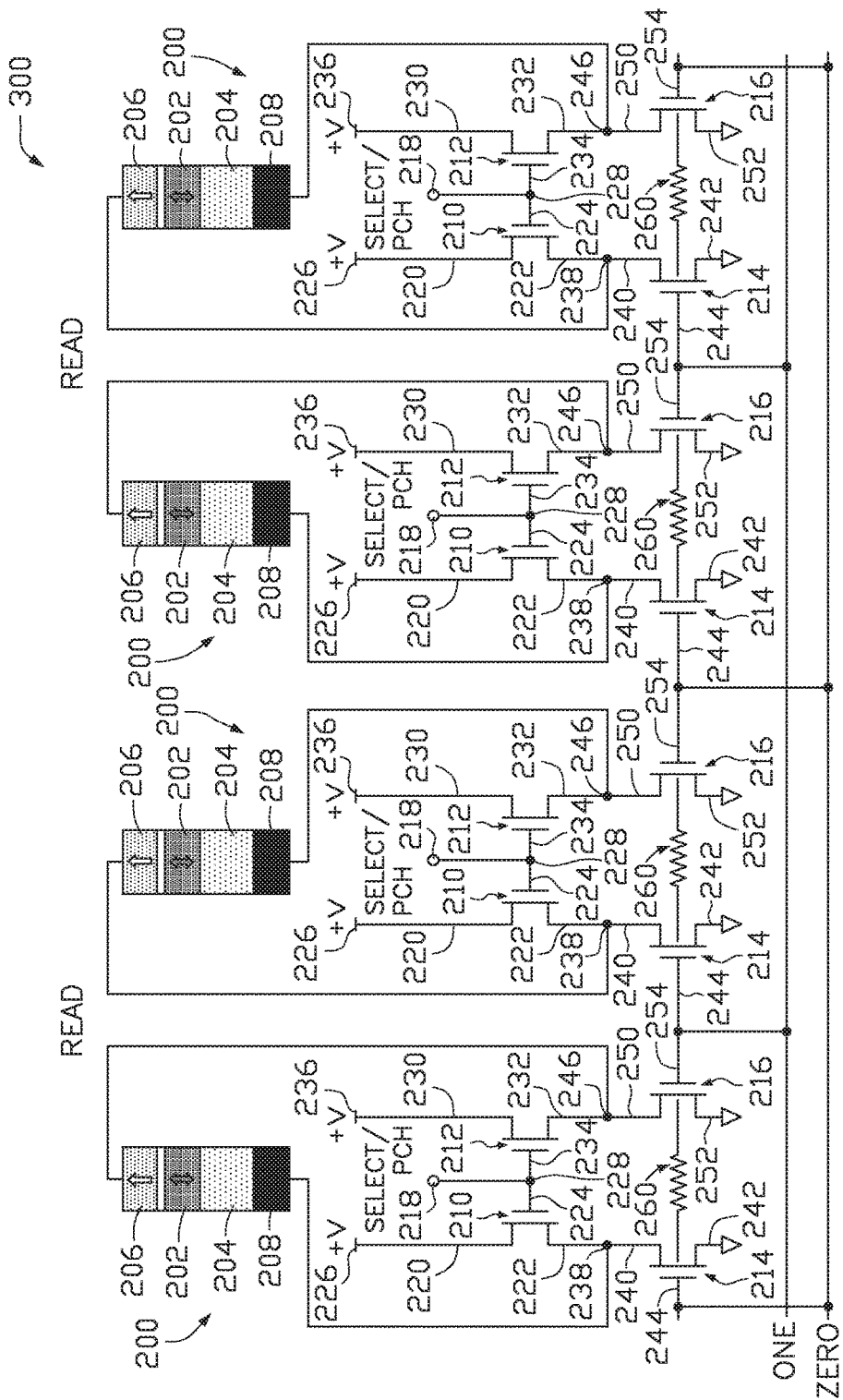
FIG. 4 is a schematic diagram of a memory array of a plurality of memory devices each comprising transistors in a pulse generator circuit, according to one embodiment described herein.

FIG. 4 is a schematic diagram of a memory array 300, according to one embodiment. The memory array 300 includes a plurality of memory devices, such as the memory device 200 as described in FIG. 3. The third transistor 214 of each memory device 200 of the memory array 300 is coupled to the fourth transistor 216 of a second memory device 200.

With reference to both FIG. 3 and FIG. 4, an amount of logic at each memory cell 200 is located to enable the formation of a defined pulse while fitting within the $4F^2$ footprint of the memory cell 200. As such, the speed and pulse shape requirements of PCM, MRAM, and other such cross-point technologies may be met.

While $4F^2$ is a typical limit for cross-point memories, it is contemplated that the memory cell footprint may also be larger or smaller than $4F^2$ in certain embodiments of the present disclosure. In some embodiments, the space between the memory cells may be smaller than 1F, thus less than $4F^2$. In other embodiments, for example, in most MRAM devices, the space between the memory cells may be larger than $12F^2$, and thus greater than $4F^2$. If the memory cell stores two or more bits per cell, the area is generally divided by the number of bits in order to calculate the effective footprint of a memory cell. As such, each memory cell 200 of the present disclosure may have a sub-lithographic footprint (i.e., a footprint smaller than less than $4F^2$), a $4F^2$ footprint, or a footprint greater than $4F^2$. The amount of logic located at each memory cell 200 may be located to enable the formation of the defined pulse while fitting within a footprint of greater than, less than, or equal to $4F^2$.

Figure 5:
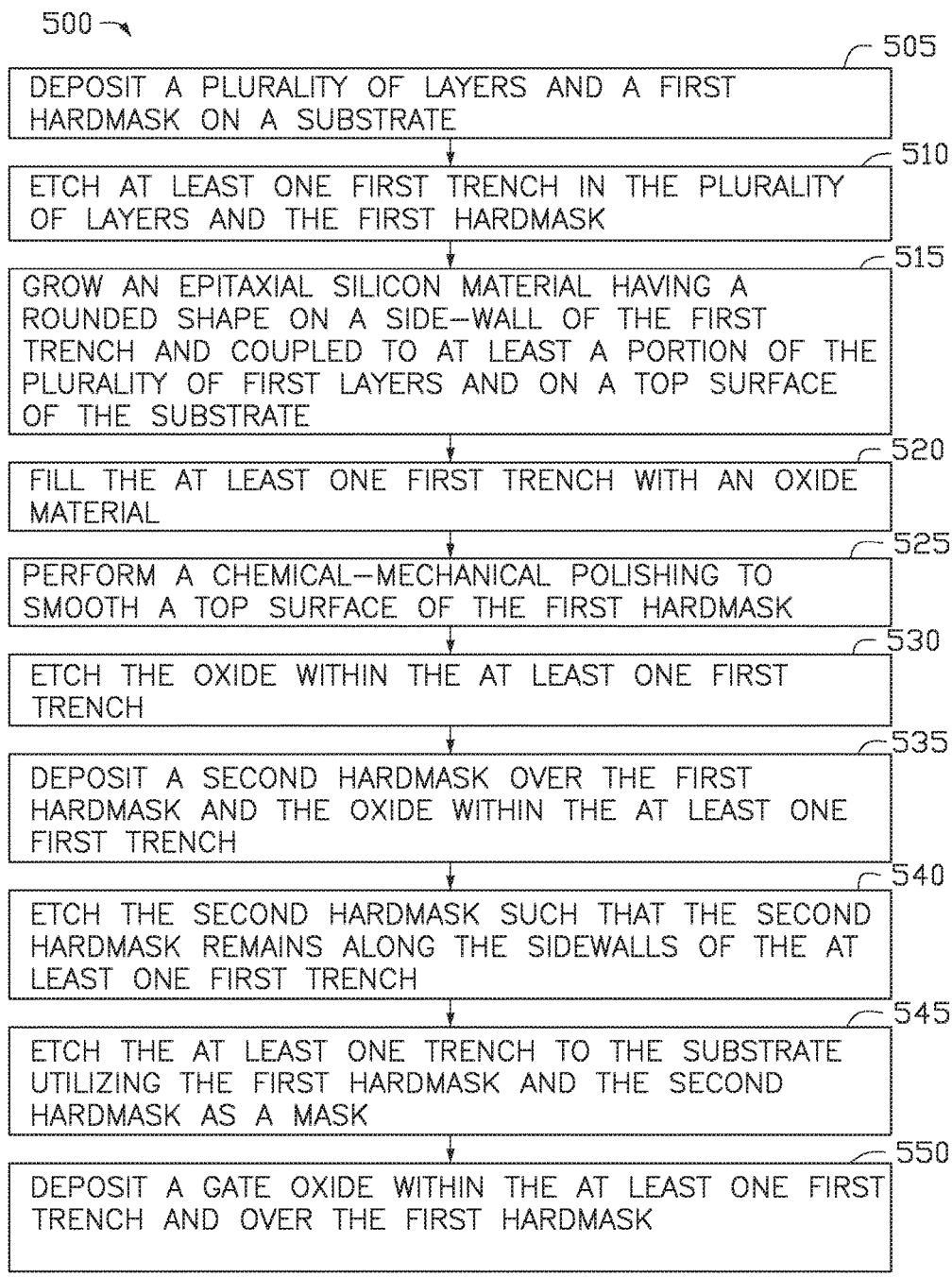
FIG. 5 illustrates operations of a method for forming a metal-oxide-semiconductor select transistor in a vertical orientation, according to embodiments described herein.
Figure 6A:
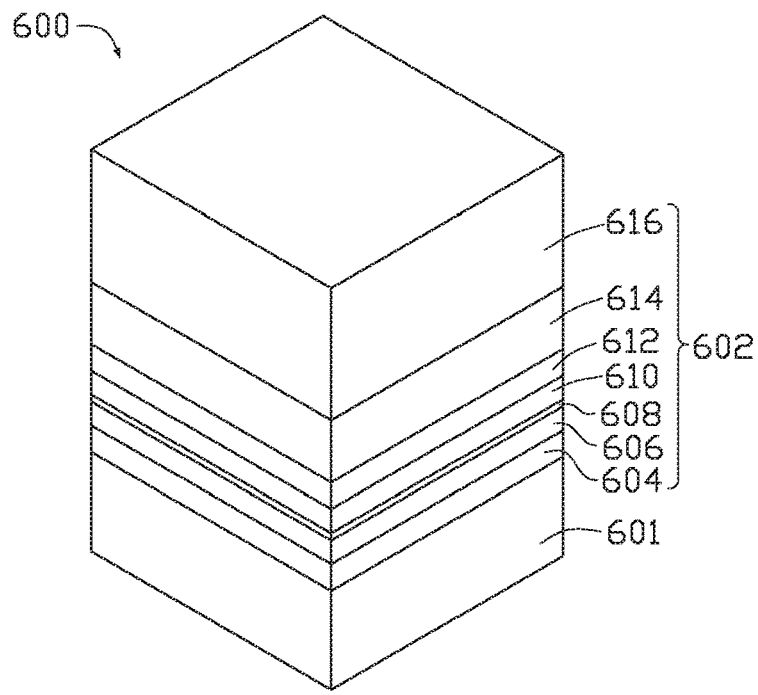
FIGS. 6A-6BB each illustrate schematic, cross-sectional views of a portion of a substrate at different stages of the method of FIG. 5, according to embodiments described herein.
Figure 6B:
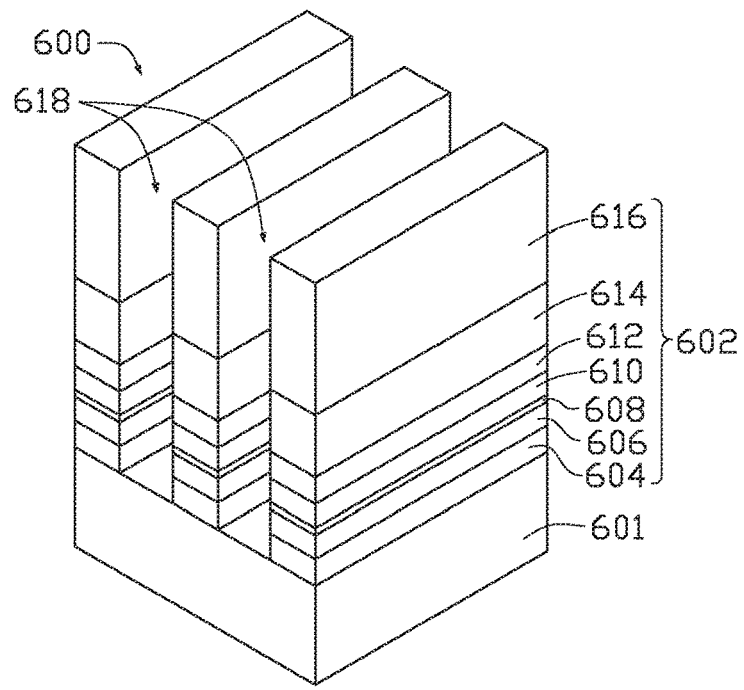

FIG. 5 illustrates operations of a method 500 of forming a metal-oxide-semiconductor (MOS) select transistor in a vertical orientation. FIGS. 6A-6BB each illustrate schematic, cross-sectional views of a portion of a memory cell 600 at different stages of the method 500 of FIG. 5. The method 500 begins at operation 505. At operation 505, a first plurality of layers 602 and a first hardmask 616 is deposited on a substrate 601, as shown in FIG. 6A. FIG. 6A illustrates the memory cell 600 which includes substrate 601, according to one embodiment. The substrate 601 may comprise a N—Si material. The substrate 601 further comprises the first plurality of layers 602 deposited thereon. In some embodiments, the first plurality of layers 602 includes a first doped silicon layer 604, a first oxide material layer 606, an amorphous silicon material layer 608, a second oxide material layer 610, a second doped silicon material layer 612, and/or a first metal material layer 614. The first doped silicon layer 604 may be disposed on the substrate 601. Furthermore, the first doped silicon layer 604 and/or the second doped silicon material layer 612 may include a N+Si material. The first oxide material layer 606 may be disposed on the first doped silicon layer 604. The amorphous silicon material layer 608 may be disposed on the first oxide material layer 606. The second oxide material layer 610 may be disposed on the amorphous silicon material layer 608. The second doped silicon material layer 612 may be disposed on the second oxide material layer 610. The first metal material layer 614 may be disposed on the second doped silicon material layer 612. The first metal material layer 614 may include a N—Si material and/or an arsenic material and/or a N—Si material doped with arsenic.

N+Si doped with arsenic provides an ohmic contact to the adjacent metal layers and may prevent or reduce significant diffusion into layer deposited films.

Furthermore, the first hardmask 616 is deposited on the first plurality of layers 602, such that the first plurality of layers 602 is sandwiched between the substrate 601 and the first hardmask 616.

At operation 510, at least one first trench 618 is etched in the first plurality of layers 602 and the first hardmask 616, as shown in FIG. 6B. It is contemplated, however, that a plurality of first trenches 618 may be etched in the first plurality of layers 602 and the first hardmask 616. As shown in FIG. 6B, two first trenches 618 are etched in the first plurality of layers 602 and the first hardmask 616; however, more or less than two first trenches 618 may be etched therein. The first trench 618 may be patterned by first forming a photomask over the first hardmask 616 to etch the first hardmask 616, and subsequently the first hardmask 616 may be utilized to etch through the first plurality of layers 602. The first trench 618 is not formed through the substrate 601.

Figure 6C:
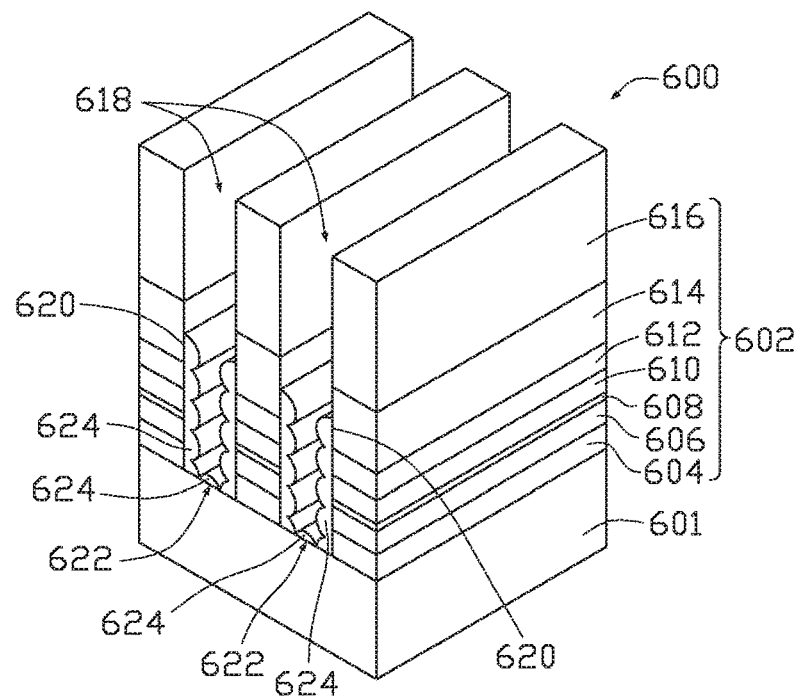

At operation 515, an epitaxial silicon material 624 is grown within each first trench 618, as shown in FIG. 6C. In some embodiments, the epitaxial silicon material 624 may be grown by a selective epitaxial process. The epitaxial silicon material 624 may be grown on a sidewall 620 of each first trench 618 and/or a top 622 of the substrate 601, such that the epitaxial silicon material 624 is coupled to at least a portion of the first plurality of layers 602 and/or the substrate 601. The epitaxial silicon material 624 may comprise a rounded shape, for example a button or bubble shape. Furthermore, in some embodiments, the epitaxial silicon material 624 may form as an isolated island. To join the isolated islands of epitaxial silicon material 624, one or more thin layers of intrinsic silicon material may be inserted into the first plurality of layers 602 to create a growth seed between each of the isolated islands. As such, additional epitaxial silicon material 624 will grow at the seed layers to connect the isolated islands of silicon by growing over the N+ regions. The epitaxial silicon material 624 may be doped lightly p-type during deposition by adding impurities to the source gas, such as diborane.

In some embodiments, the growing may be a low temperature epitaxial process which is slow and controllable. The selective epitaxial process disclosed only may grow on exposed N+ silicon surfaces. The thickness of the growth may be less than or equal to about half of a width of the first trench 618 to prevent pinching off the first trench 618.

Figure 6D:
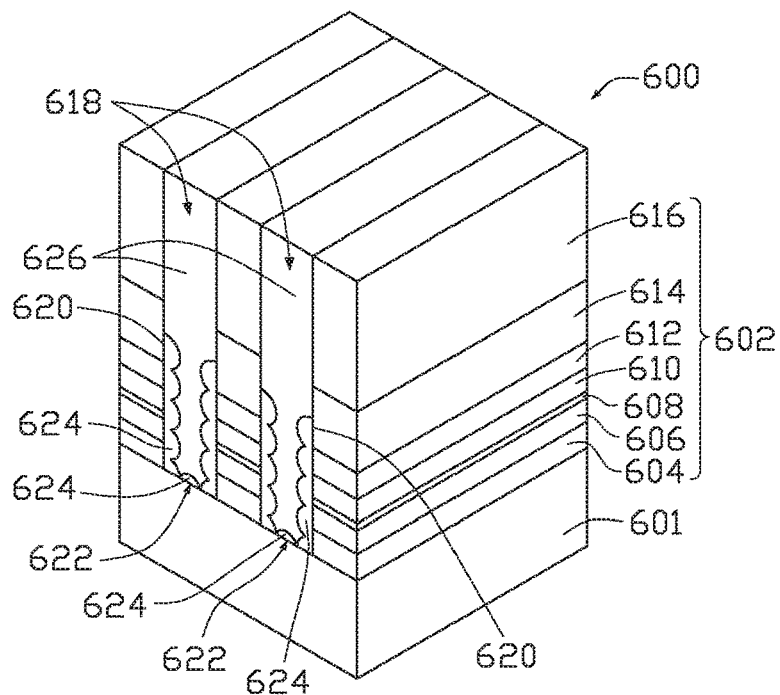

At operation 520, the remaining area of the first trench 618 is filled with an oxide material 626, as shown in FIG. 6D. As such, the oxide material 626 is deposited in the first trench 618. In some embodiments, the oxide material 626 may be a conformal oxide layer, which is typically deposited via ALD. Some voids may be present within the first trench 618; however, and voids may be altered.

At operation 525, once the first trench 618 is filled with the oxide material 626, the oxide material 626 may be chemical mechanically polished back to the first hardmask 616, as also shown in FIG. 6D. The oxide material 626 electrically isolates the plurality of layers 602, other than the N+ layer and other thin silicon layers from conductors yet to be formed in a center of the first trench 618.

Figure 6E:
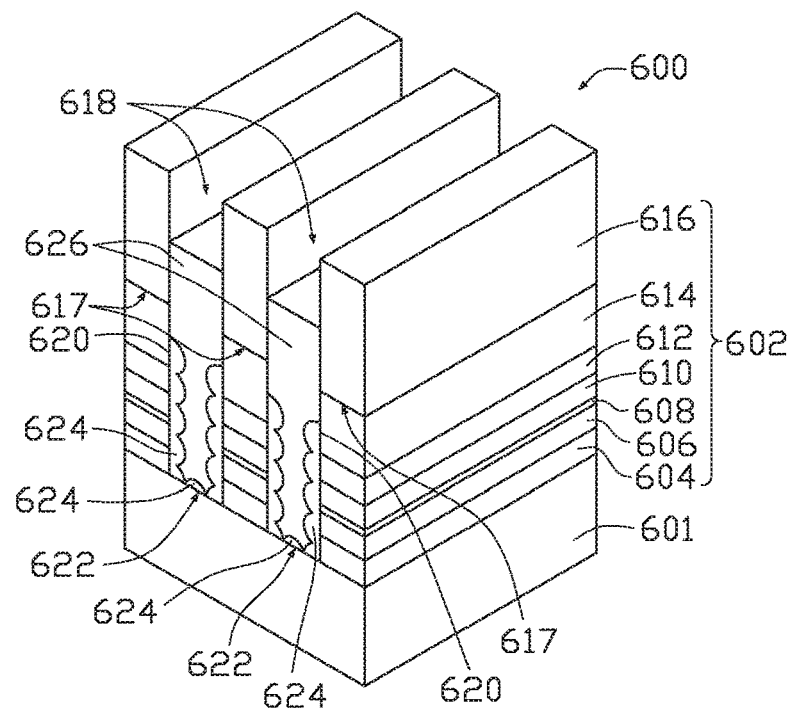

At operation 530, the oxide material 626 is etched within the first trench 618, as shown in FIG. 6E. The oxide material 626 is etched to recess the oxide material 626 all around the first hardmask 616. The depth of the etch should be less than the bottom 617 of the first hardmask 616, as illustrated in FIG. 6E.

Figure 6F:
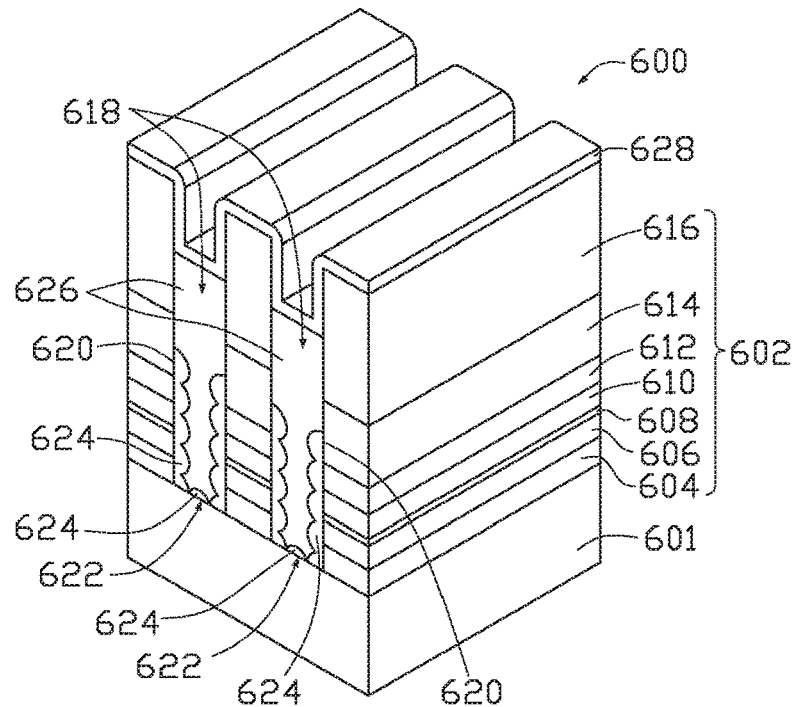

At operation 535, a second hardmask 628 is deposited over the first hardmask 616 and the oxide material 626 within the first trench 618, as shown in FIG. 6F. The second hardmask 628 may be a thin conformal layer of hardmask material. The first hardmask 616 and the second hardmask 628 may comprise the same material. The thickness of the second hardmask 628 may be approximately equal to the thickness of the grown epitaxial silicon material 624. In some embodiments, the second hardmask 628 may comprise rounded edges.

Figure 6G:
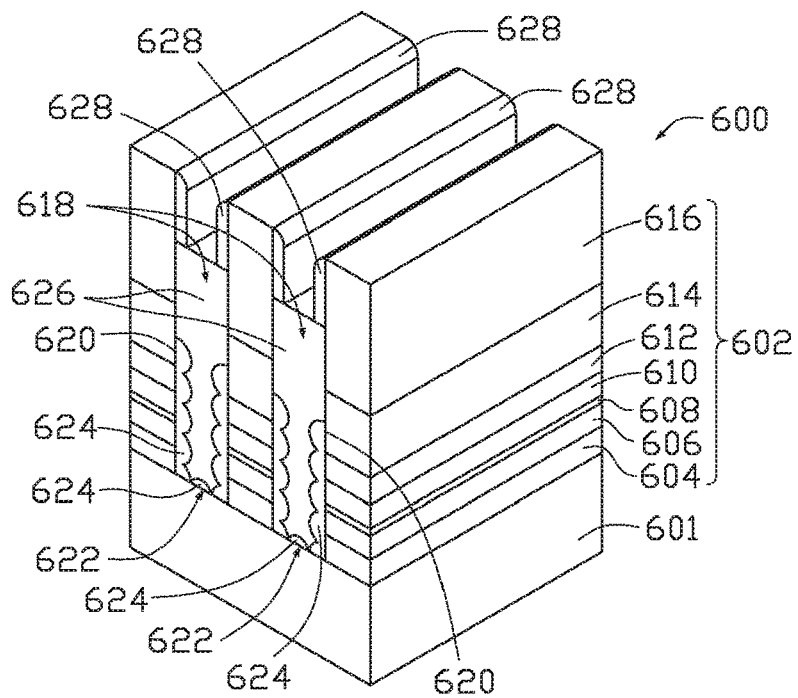

At operation 540, the second hardmask 628 is etched such that the second hardmask 628 remains along the sidewalls 620 of the first trench 618, as shown in FIG. 6G. The thin conformal layer of second hardmask 628 may be RIE etched back to leave the second hardmask 628 on the sidewalls 620 of the first hardmask 616 with a sidewall spacer etch technique.

Figure 6H:
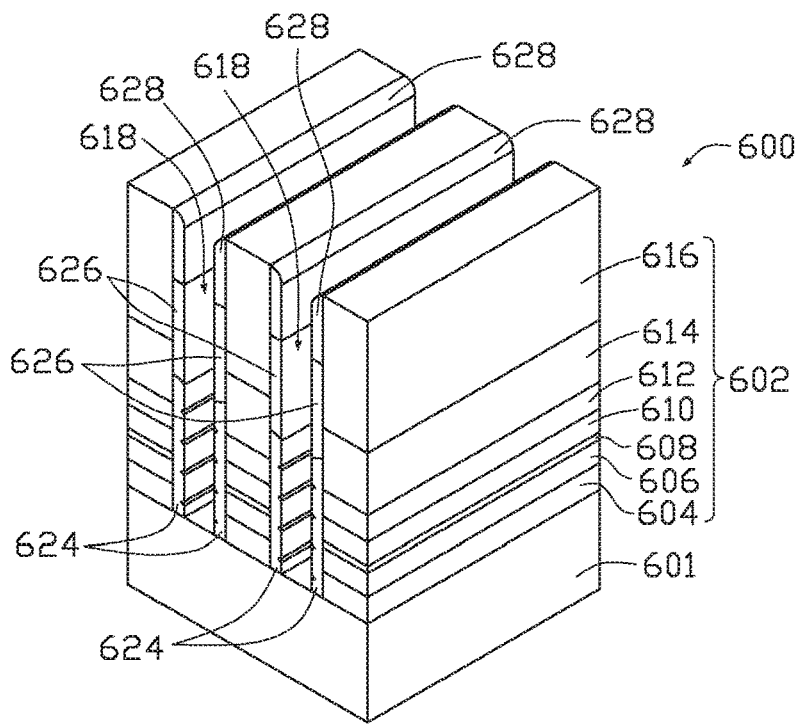

At operation 545, the first trench 618 is etched to the substrate 601 utilizing the first hardmask 616 and the second hardmask 628 as a mask, as shown in FIG. 6H. Via the use of the second hardmask 628 in conjunction with the first hardmask 616 as an etch mask, the center of the first trench 618 is etched back down to the substrate 601. The second hardmask 628 narrows the opening of the first trench 618 such that the etch removes the oxide material 626 in the center of the first trench 618 and opens up any voids in the oxide material 626 while not etching or minimally etching the epitaxial silicon material 624. As such, the etch of operation 545 goes down to the surface of the substrate 601 where metal contacts to the top of select devices may have formed prior to operation 545.

Figure 6I:
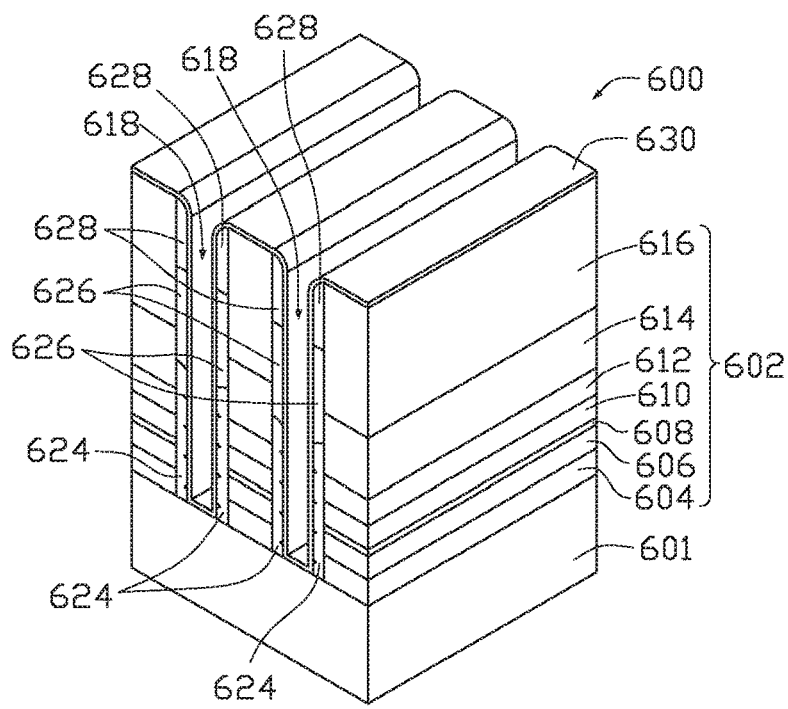

At operation 550, a gate oxide material 630 is deposited within the first trench 618 and over the first hardmask 616 and/or the second hardmask 628, as shown in FIG. 6I. A conformal oxide may be deposited using ALD or a combination of oxide growth and ALD to form the gate oxide material 630 over the epitaxial silicon material 624.

Figure 6J:
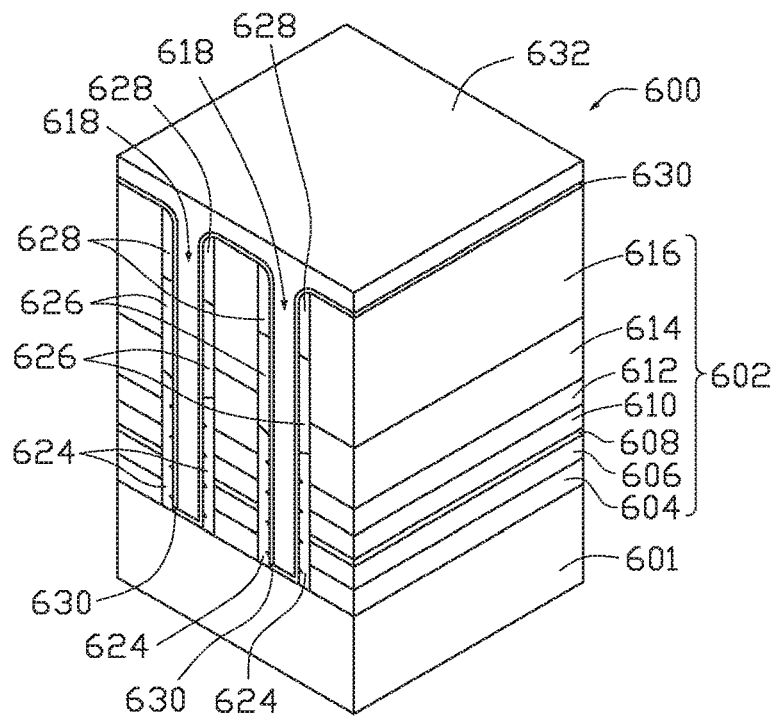

The method 500 may further include depositing a second metal layer 632 within the first trench 618 and on or over the gate oxide material 630, as shown in FIG. 6J. In some embodiments, the second metal layer 632 comprises a tungsten material.

Figure 6K:
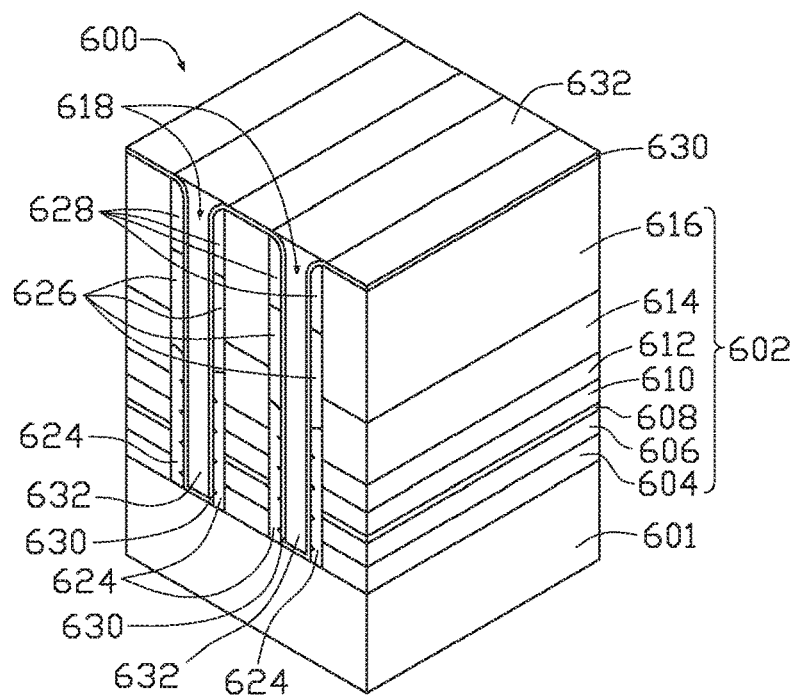

The method 500 may further include performing a CMP to remove the second metal layer 632 from the gate oxide material 630, as shown in FIG. 6K. In some embodiments, the CMP may remove the second metal layer 632 back to the surface of the first hardmask 616. In other embodiments, the CMP may remove the second metal layer 632 back to the surface of the gate oxide material 630 such that the rounded edges of the gate oxide material 630 are maintained. As such, the thickness of the second metal layer 632 within the first trench 618 may increase as the second metal layer 632 nears the rounded edges of the second hardmask 628.

Figure 6L:
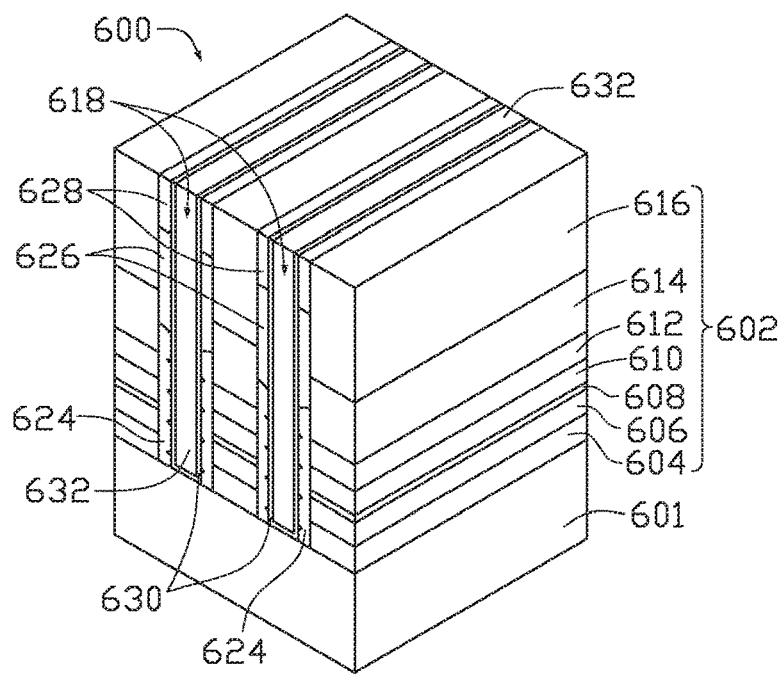

The method 500 may further include performing a CMP to remove the gate oxide material 630 from the first hardmask 616, as shown in FIG. 6L. As such, the CMP is performed to the top of the second metal layer 632 to enable making top contacts to the second metal layer 632.

Figure 6M:
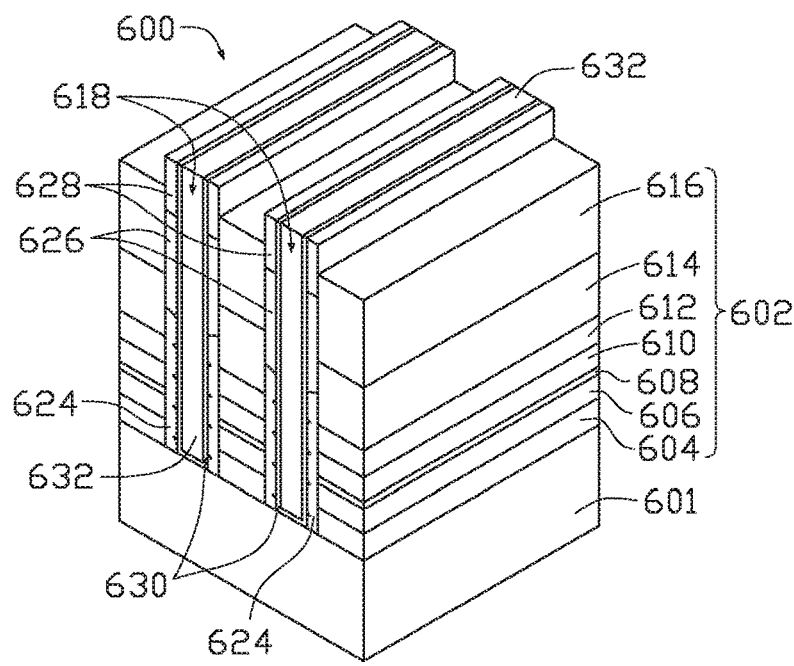

The method 500 may further include etching the first hardmask 616 such that the first trench 618 protrudes out of the first hardmask 616, as shown in FIG. 6M. The etching of the first hardmask 616 leaves a portion of the second hardmask 628, a portion of the gate oxide material 630, and a portion of the second metal layer 632 exposed above the first hardmask 616.

Figure 6N:
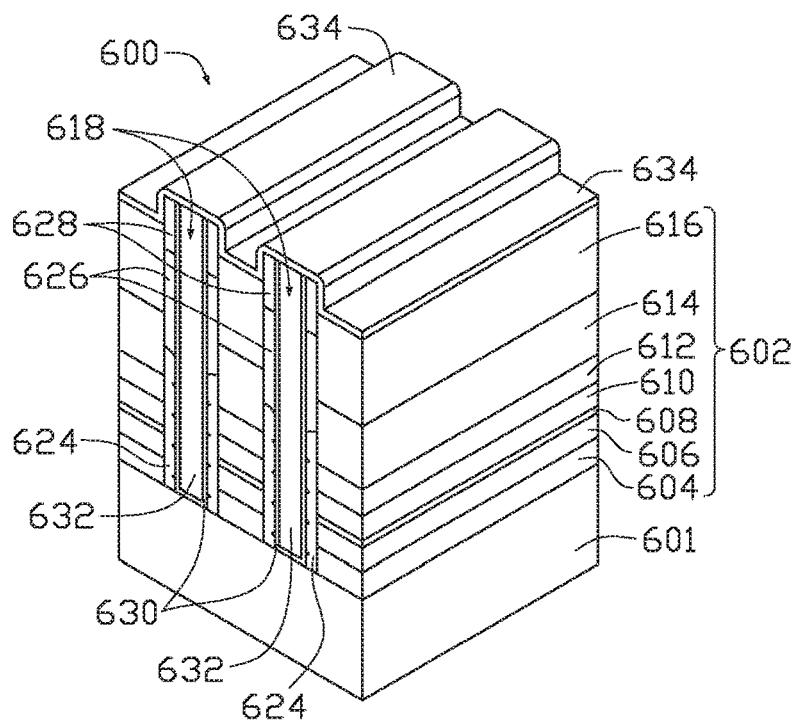

The method 500 may further include depositing a third hardmask 634 over the first hardmask 616 and the first trench 618, as shown in FIG. 6N. The third hardmask 634 may be a thin conformal layer of hardmask material. The third hardmask 634 may comprise the same material as the first hardmask 616 and/or the second hardmask 628.

Figure 6O:
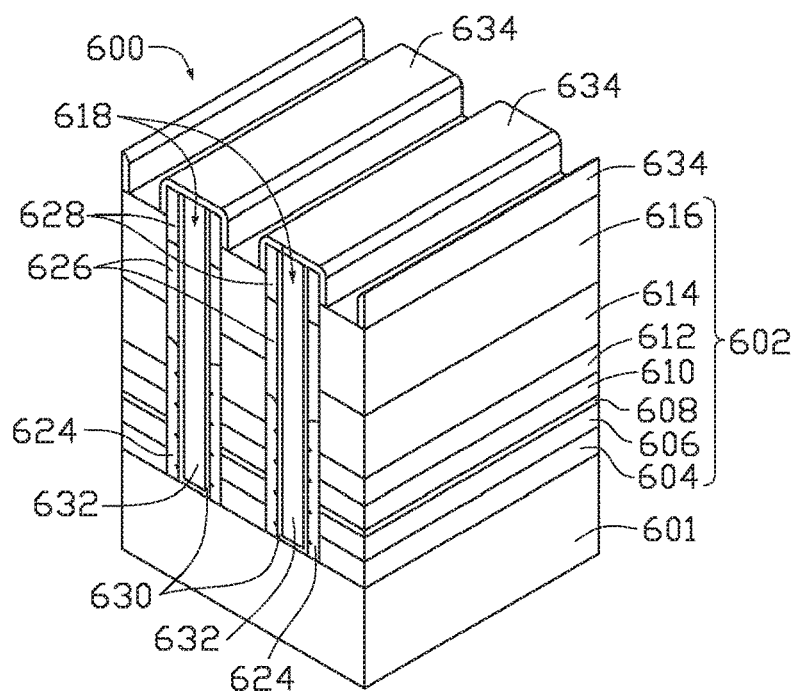

The method 500 may further include etching the third hardmask 634 such that the third hardmask 634 covers at least the first trench 618, as shown in FIG. 6O. As such, a spacer etch may be performed with respect to the third hardmask 634. A sidewall spacer may be formed around the exposed portion of the first trench, as described in supra.

Figure 6P:
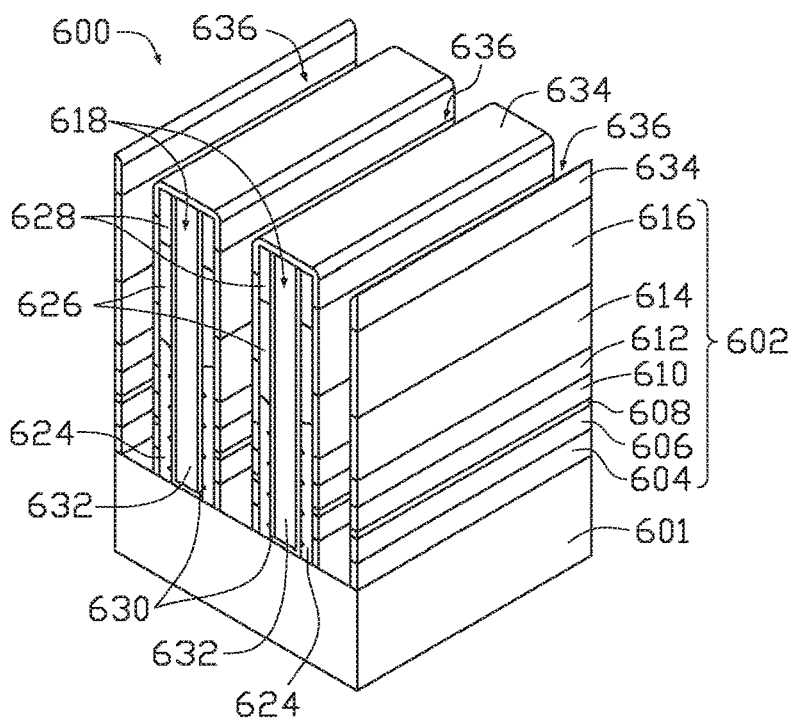

The method 500 may further include etching at least one second trench 636 through the first hardmask 616, adjacent the first trench 618, as shown in FIG. 6P. The second trench 636 is parallel to the first trench 618. The second trench 636 may be etched through the first hardmask 616 and the first plurality of layers 602.

Figure 6Q:
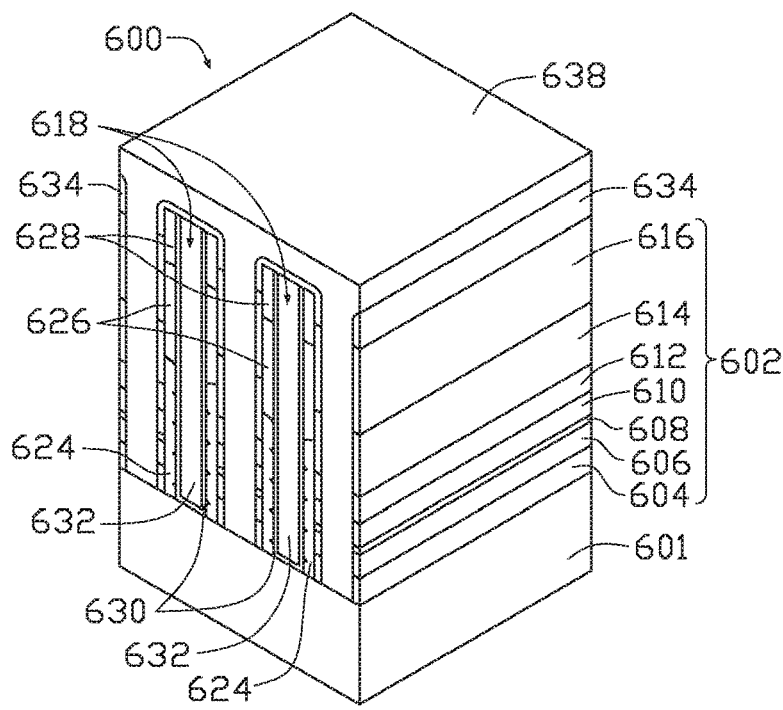

The method 500 may further include depositing a first dielectric material 638 in the second trench 636, as shown in FIG. 6Q. In some embodiments, the first dielectric material 638 may at least partially fill the second trench 636. The first dielectric material 638 may include a nitride material.

Figure 6R:
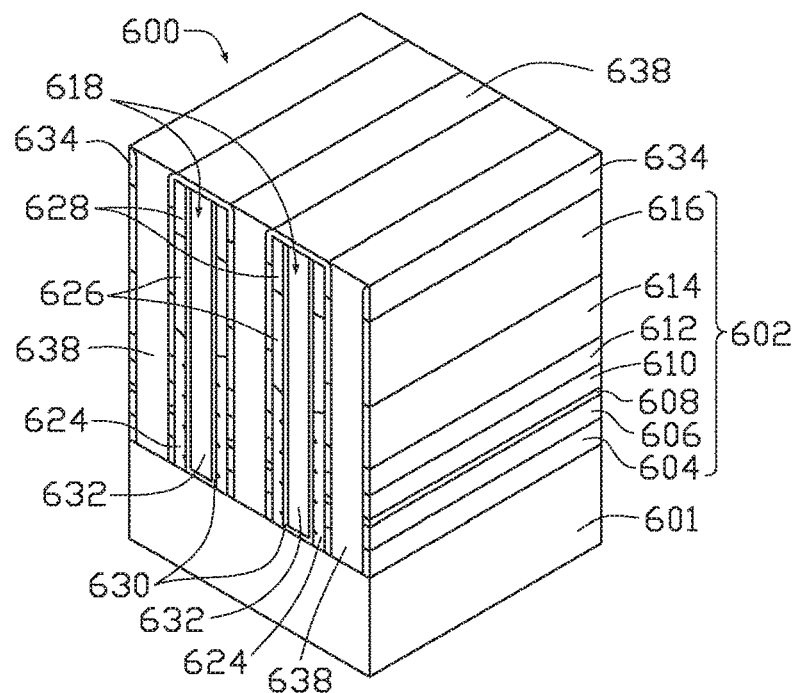
Figure 6S:
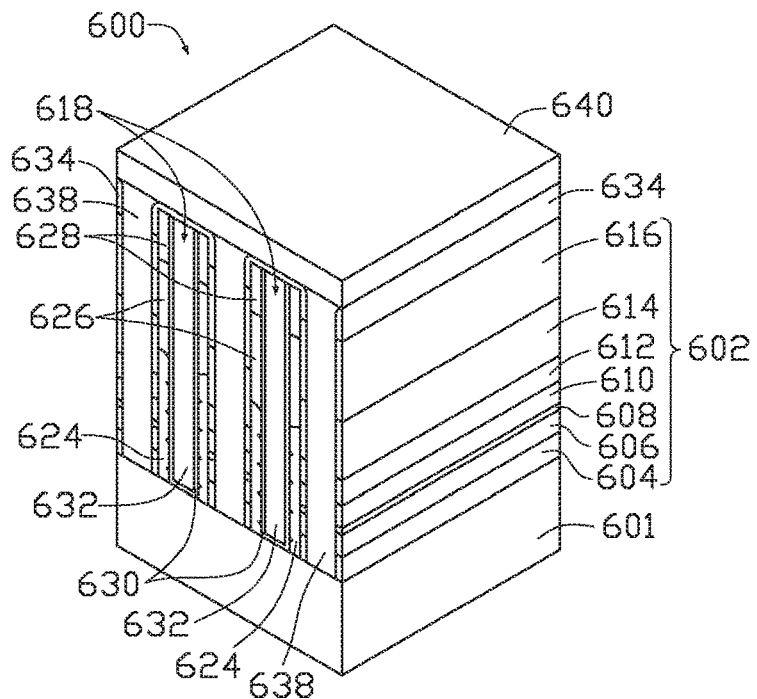
Figure 6T:
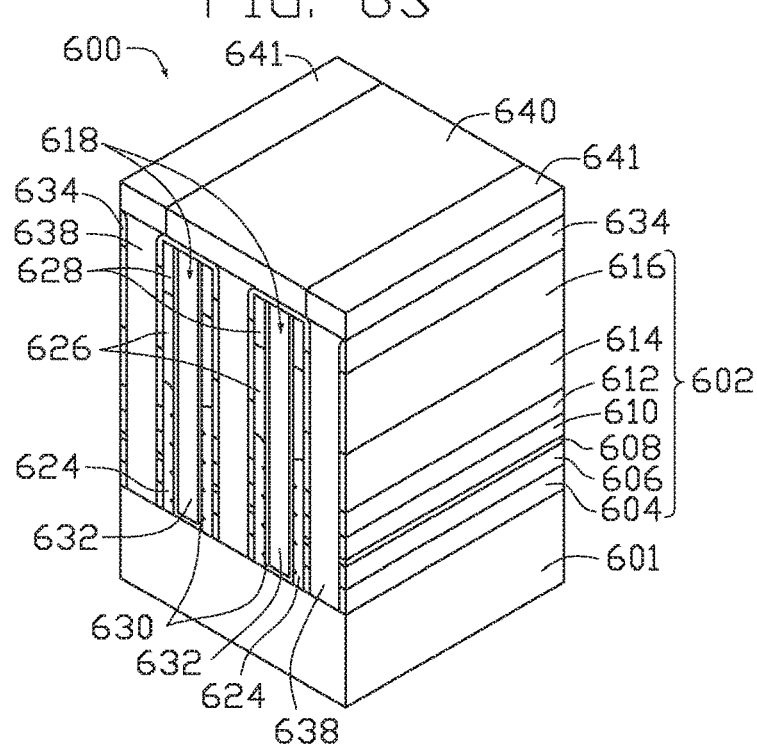
Figure 6U:
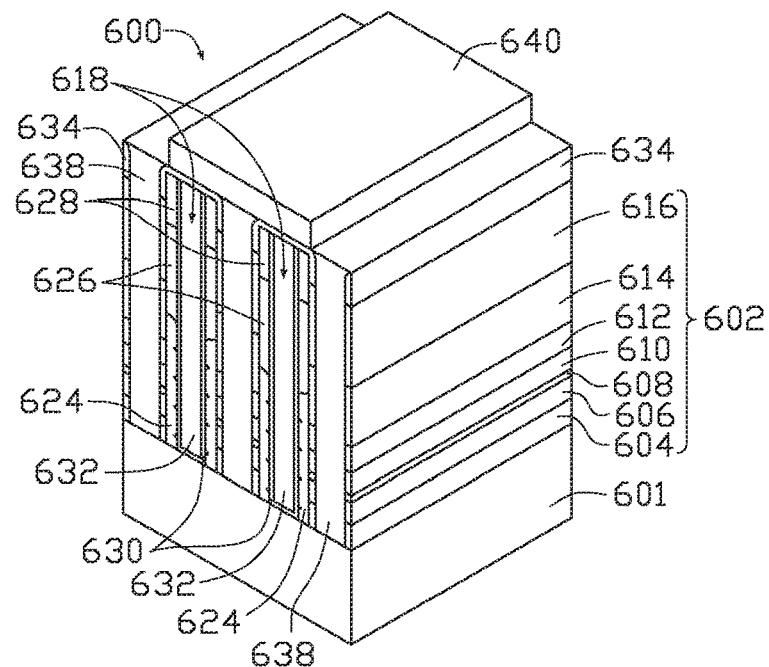

The method 500 may further include performing a CMP to remove the first dielectric material to third hardmask 634, as shown in FIG. 6R. The method 500 may further include depositing a spin photoresist layer 640 on the third hardmask and the first dielectric material 638, as shown in FIG. 6S. The method 500 may further include exposing a first part of spin photoresist layer 640 to form an exposed layer 641, as shown in FIG. 6T. The method 500 may further include developing the spin photoresist layer 640 to remove the unexposed spin photoresist layer 640, as shown in FIG. 6U.

Figure 6V:
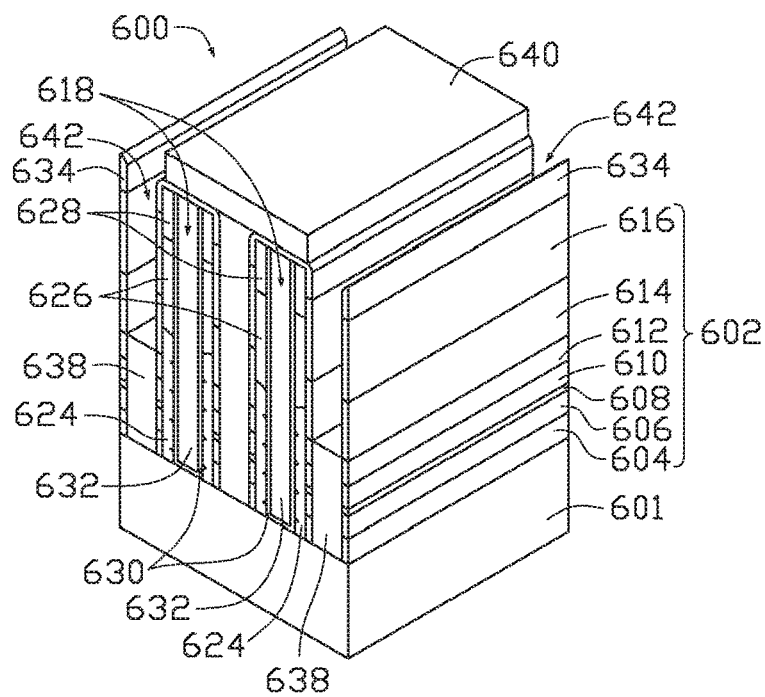

The method 500 may further include etching the first dielectric material 638 disposed under the unexposed and removed spin photoresist layer 640, as shown in FIG. 6V. As such, the first dielectric material 638 is removed from alternate second trenches 636, thus yielding an alternate second trench 642. The alternate second trench 642 may be substantially similar to the second trench 636; however the alternate second trench 642 comprises the first dielectric material 638 therein.

Figure 6W:
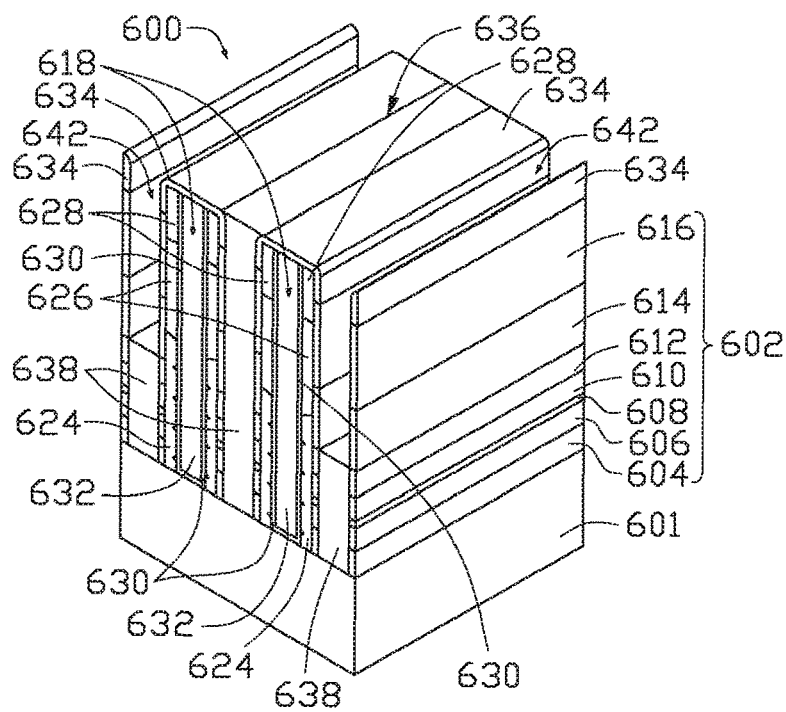

The method 500 may further include stripping the remaining spin photoresist layer 640, as shown in FIG. 6W.

Figure 6X:
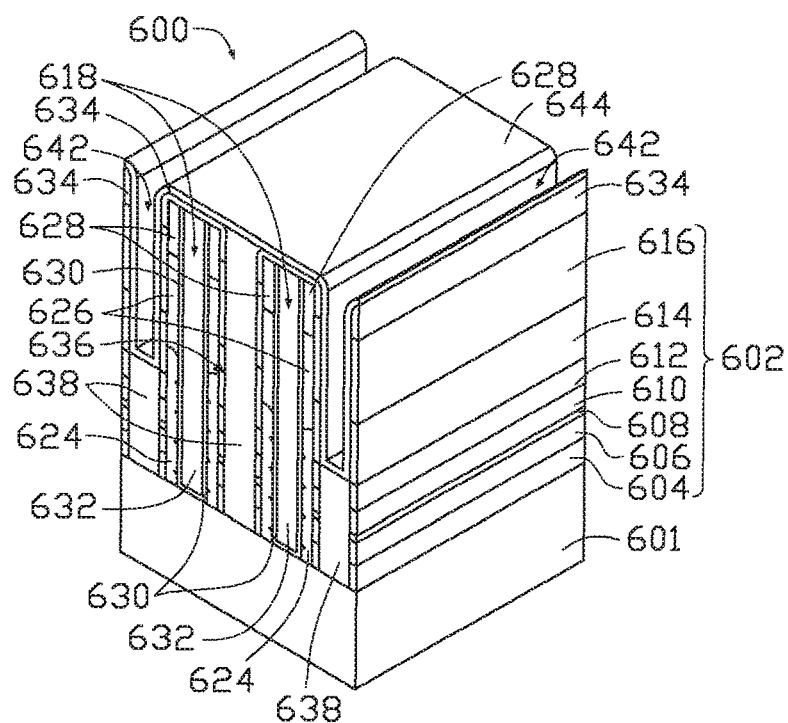

The method 500 may further include depositing a third metal layer 644 in at least one second trench 636 and/or at least one alternate second trench 642 and on the first dielectric material 638, as shown in FIG. 6X. The third metal layer 644 may comprise at least one rounded edge. The third metal layer 644 may be conformally deposited. In some embodiments, the third metal layer 644 may comprise the same material as the first metal material layer 614, for example, a N—Si material and/or an arsenic material and/or a N—Si material doped with arsenic.

Figure 6Y:
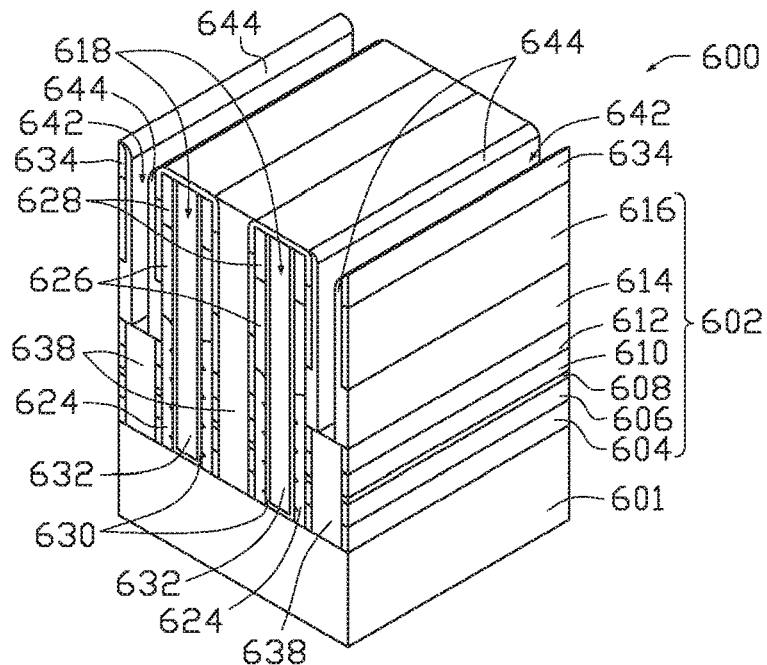

The method 500 may further include etching the third metal layer 644 to remove the third metal layer 644 from the first dielectric material 638, as shown in FIG. 6Y. As shown, the third metal layer 644 and the first metal material layer 614 may meet within an area of the second trench 636 and/or alternate second trench 642, thus increasing the thickness of the material of the third metal layer 644 and/or the first metal material layer 614.

Figure 6Z:
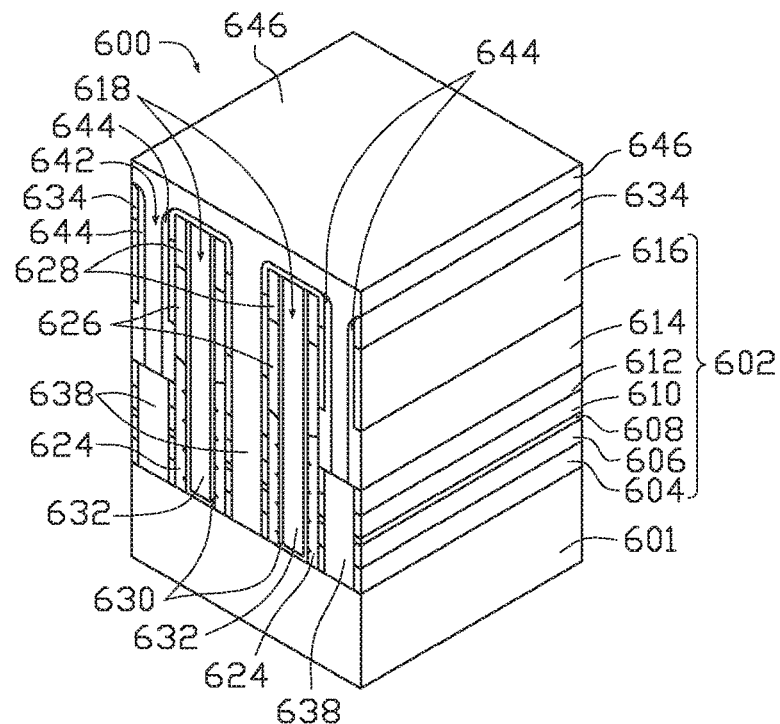
Figure 6A:
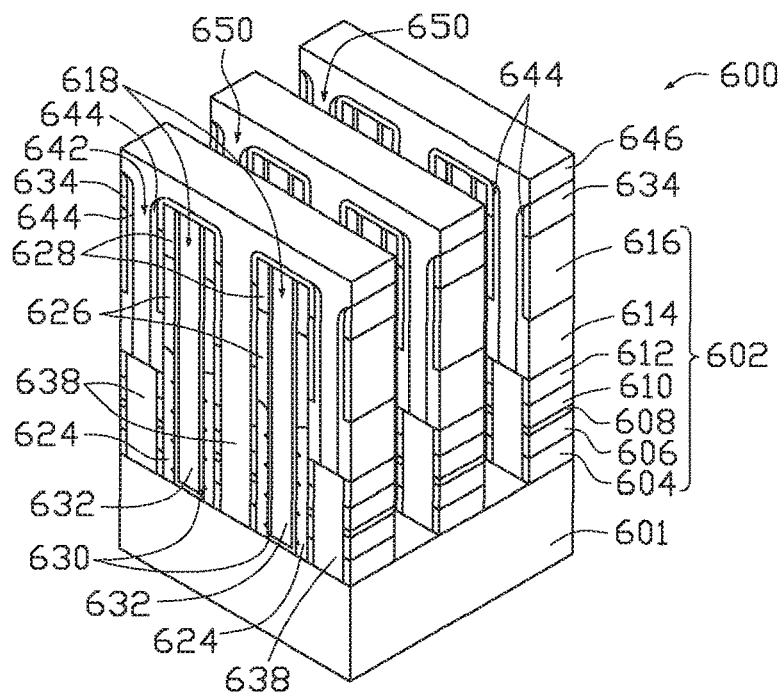
Figure 6B:
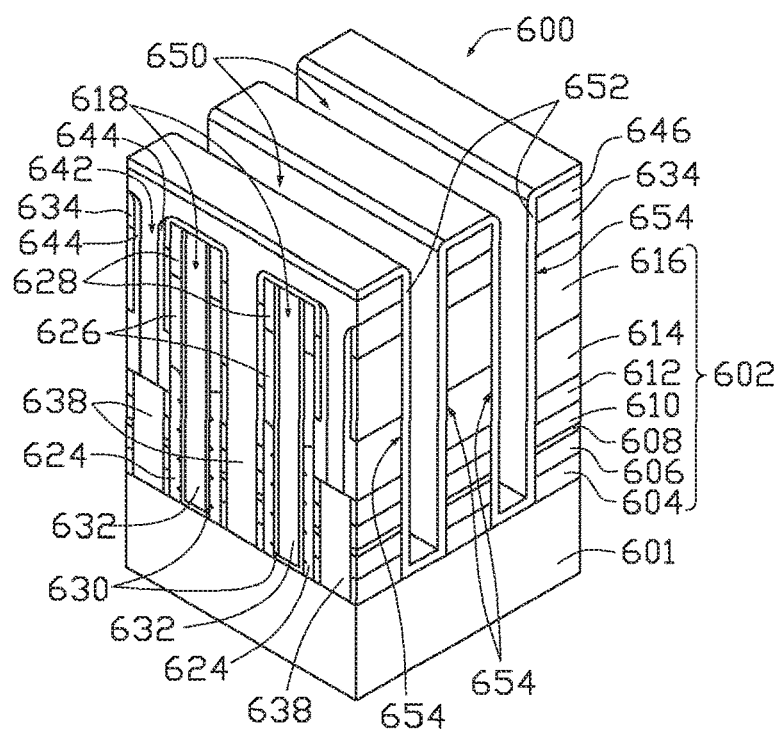

The method 500 may further include depositing a second dielectric material 646 in the second trench and/or the second alternate trench 642, as shown in FIG. 6Z. The second dielectric material 646 may comprise a nitride material. In some embodiments, the second dielectric material 646 may be substantially similar to the first dielectric material 638.

The method 500 may further include patterning a third trench 650 in the memory cell 600, wherein the third trench 650 is perpendicular to the second trench 636, and etching to remove the second dielectric material 646, as shown in FIG. 6AA. It is contemplated that any number of third trenches 650 may be patterned, and although two third trenches 650 are shown in FIG. 6AA it is contemplated that there may be more or less third trenches 650 patterned therein. In some embodiments, the third trench 650 may be orthogonal to the first trench 618. The third trench 650 may extend through the second dielectric material 646 and the first plurality of layers 602.

The method 500 may further include depositing a third dielectric material 652 along a sidewall 654 of the third trench 650, as shown in FIG. 6BB. As such, the third trench 650 may be lined with the third dielectric material 652. The third dielectric material may comprise a nitride material.

The resulting structure is a plurality of NMOS transistors in a grid pattern where the N+ layers are sources and drains. The epitaxial silicon material 624 forms the channels of the NMOS and the metal columns running vertically are NMOS gates, which are separated from the epitaxial silicon material 624 by the gate oxide material 630. The N+ layers are sufficiently heavily doped to provide an ohmic contact to the adjacent metal areas and to cause auto doping of the end regions of the epitaxial silicon material 624 channel.

While the present disclosure illustrates apparatus and operations in the process for the fabrication of metal-oxide-semiconductor (MOS) select transistors in a vertical orientation such that the transistor pair fits within the footprint of a $4F^2$ memory cell while depicting a single transistor layer or level, it will be clear and understood to one having ordinary skill in the art that multiple levels may be fabricated simultaneously. As such, the disclosed transistor design may be used for emerging memory such as PRAM, ReRAM, and MTJ memory array designs.

With respect to FIG. 5, it is further contemplated that, in some embodiments, the memory cell may have a footprint of greater than or less than $4F^2$, as discussed supra.

Additional benefits of the present disclosure include that the metal-oxide semiconductor select transistor fits within a footprint of a $4F^2$ memory cell. The present disclosure further enables the use of metal interconnects to build larger arrays than interconnects comprising silicon. As such, a pair of transistors is built which maintain a shared gate, thus enabling circuit designs having a tunable rapid pulse cutoff at the memory bit for PCM and MTJ cell operation.

In summation, apparatus and methods relating to the fabrication of metal-oxide-semiconductor (MOS) select transistors in a vertical orientation such that the transistor pair fits within the footprint of a $4F^2$ memory cell is disclosed. The present disclosure further relates to the simultaneous fabrication of a vertical stack of transistors in which each transistor is distinct, as opposed to being serially connected in a NAND-like string. An initial stack of materials is built to include silicon layers to act as source and drain regions as well as to serve as epitaxial growth seed points. As such, the transistor disclosed may be utilized with memory such as PRAM, ReRAM, and MTJ memory array designs, among others.

While the foregoing is directed to embodiments of the present disclosure, other and further embodiments of the disclosure may be devised without departing from the basic scope thereof, and the scope thereof is determined by the claims that follow.

What is claimed is:

1. A memory cell, comprising:
a first plurality of layers deposited on a substrate;
a first hardmask deposited on the first plurality of layers, wherein a first plurality of trenches are formed through the first hardmask and the first plurality of layers;
an epitaxial silicon material comprising a rounded shape and disposed on a sidewall of each of the first plurality of trenches;
an oxide material deposited in each of the first plurality of trenches;
a gate oxide layer deposited in each of the first plurality of trenches;
a first metal material deposited over the gate oxide layer within each of the first plurality of trenches;
a second plurality of trenches formed parallel to the first plurality of trenches and through the first hardmask and the first plurality of layers, wherein the second plurality of trenches are at least partially filled with a dielectric material, and wherein at least one of the second plurality of trenches comprises a second metal material such that a first width of the dielectric material below the second metal material is wider than a second width of the dielectric material above the second metal material.

2. The memory cell of claim 1, further comprising:
a third plurality of trenches formed perpendicular to the first plurality of trenches and extending through the dielectric material and the first plurality of layers.

3. The memory cell of claim 2, wherein the third plurality of trenches are lined with a second dielectric material.

4. The memory cell of claim 1, wherein the first plurality of layers comprises:
a first doped silicon material disposed on the substrate;

a first oxide material disposed on the first doped silicon material an amorphous silicon material disposed on the first oxide;

a second oxide material disposed on the amorphous silicon material;

a second doped silicon material disposed on the second oxide material; and the second metal material disposed on the second doped silicon material.

5. The memory cell of claim 4, wherein the substrate comprises a silicon material.

6. The memory cell of claim 4, wherein the first doped silicon material and the second doped silicon material each comprise an N+ doped silicon material.

7. The memory cell of claim 1, wherein the second metal material comprises an arsenic material.

8. The memory cell of claim 1, wherein the first metal material comprises a tungsten material.

9. The memory cell of claim 1, wherein a thickness of the epitaxial silicon material is less than or equal to about half of a width of the respective trench of the first plurality of trenches.

10. The memory cell of claim 1, wherein the first plurality of trenches and the third plurality of trenches are each two or more trenches.

11. The memory cell of claim 1, wherein the second plurality of trenches is three or more trenches.

12. A vertical memory cell, comprising:
a first layer;
a second layer; and
a plurality of transistors, comprising:
 a first transistor disposed within the first layer and having a source node coupled to a first voltage source and a drain node coupled to a word line of the vertical memory cell,
 a second transistor disposed within the first layer and having a source node coupled to a second voltage source and a drain node coupled to a bit line of the vertical memory cell,
 a third transistor disposed within the second layer and having a source node coupled to the drain node of the first transistor, and
 a fourth transistor disposed within the second layer and having a source node coupled to the drain node of the second transistor,
 wherein gate electrodes of the first and second transistors are coupled to a same node.

13. The vertical memory cell of claim 12, wherein the plurality of transistors are arranged in a $4F^2$ footprint.

14. The vertical memory cell of claim 12, further comprising a first vertical connection between the first layer and the second layer configured to couple the drain node of the first transistor to the source node of the third transistor wherein the first vertical connection comprises one or more of a silicon material and a metal material.

15. The vertical memory cell of claim 12, further comprising a first vertical connection between the first layer and the second layer configured to couple the drain node of the first transistor to the source node of the third transistor.

16. The vertical memory cell of claim 15, further comprising a second vertical connection between the first layer and the second layer configured to couple the drain node of the second transistor to the source node of the fourth transistor.

17. The vertical memory cell of claim 12, wherein drain nodes of the third and fourth transistors are coupled to ground.

18. A memory device, comprising:
a memory cell disposed at an intersection between a bit line and a word line;
a first transistor disposed within a first layer and comprising:
 a first source node coupled to a first source voltage potential,
 a first drain node coupled to the word line, and
 a first gate node coupled to a common node;
a second transistor disposed within the first layer and comprising:
 a second source node coupled to a second source voltage potential,
 a second drain node coupled to the bit line, and
 a second gate node coupled to the common node;
a third transistor disposed within a second layer and comprising:
 a third source node coupled to the drain node of the first transistor,
 a third drain node coupled to ground, and
 a third gate node coupled to a first control line; and
a fourth transistor disposed within the second layer and comprising:
 a fourth source node coupled to the drain node of the first transistor,
 a fourth drain node coupled to ground, and
 a fourth gate node coupled to a second control line.

19. The memory device of claim 18, further comprising a resistor coupled between the third transistor and the fourth transistor.

* * * * *